(12) United States Patent
Jiang et al.

(10) Patent No.: US 10,983,415 B2
(45) Date of Patent: Apr. 20, 2021

(54) SHUTTER DEVICE, METHOD OF CONTROLLING SAME, PHOTOLITHOGRAPHY MACHINE, AND METHOD OF CONTROLLING EXPOSURE DOSE THEREOF

(71) Applicant: SHANGHAI MICRO ELECTRONICS EQUIPMENT (GROUP) CO., LTD., Shanghai (CN)

(72) Inventors: Zhiyong Jiang, Shanghai (CN); Fuping Zhang, Shanghai (CN); Yanfei Wang, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/480,639

(22) PCT Filed: Jan. 25, 2018

(86) PCT No.: PCT/CN2018/074089
§ 371 (c)(1),
(2) Date: Jul. 24, 2019

(87) PCT Pub. No.: WO2018/137676
PCT Pub. Date: Aug. 2, 2018

(65) Prior Publication Data
US 2019/0391463 A1    Dec. 26, 2019

(30) Foreign Application Priority Data
Jan. 25, 2017    (CN) .......................... 201710061013.3

(51) Int. Cl.
*G03B 9/22*     (2021.01)
*G03B 9/62*     (2021.01)
*H02K 33/12*    (2006.01)

(52) U.S. Cl.
CPC ............. *G03B 9/22* (2013.01); *G03B 9/62* (2013.01); *H02K 33/12* (2013.01)

(58) Field of Classification Search
USPC ...................................................... 396/452
See application file for complete search history.

(56) References Cited

U.S. PATENT DOCUMENTS 3,956,761 A  *  5/1976  Koch ..................... G03B 9/08
                                                          396/496
4,265,530 A     5/1981  Petersen
(Continued)

FOREIGN PATENT DOCUMENTS

CN         1049918 A      3/1991
CN       101351769 A      1/2009
(Continued)

*Primary Examiner* — Rodney E Fuller
(74) *Attorney, Agent, or Firm* — Muncy, Geissler, Olds & Lowe, P.C.

(57) ABSTRACT

A shutter device includes a light blocking unit and a voice coil motor. The voice coil motor includes a permanent magnet module, a guide track assembly and a coil assembly. The coil assembly is arranged on the guide track assembly, and the permanent magnet module is adapted to produce a magnetic field in the guide track assembly. The light blocking unit includes two shutter blades both connecting to the coil assembly. When energized, the coil assembly will produce a magnetic field having a direction same as or opposite to the direction of the magnetic field in the guide track assembly so that the coil assembly moves forward or backward along the guide track assembly to drive the two shutter blades to open or close. A method controls the shutter device. An exposure dose control method is used with a photolithography machine including the shutter device.

17 Claims, 6 Drawing Sheets

(56) References Cited

U.S. PATENT DOCUMENTS

| | | | |
|---|---|---|---|
| 4,268,153 A | | 5/1981 | Sugiura et al. |
| 4,839,679 A | * | 6/1989 | Cameron ................. G03B 9/08 |
| | | | 396/469 |
| 5,706,120 A | | 1/1998 | O'Brien et al. |
| 6,046,836 A | * | 4/2000 | Tuchman ............... G02B 26/04 |
| | | | 359/227 |
| 2003/0002021 A1 | * | 1/2003 | Sato .................... G03F 7/70358 |
| | | | 355/67 |
| 2007/0110432 A1 | | 5/2007 | Viglione et al. |
| 2008/0031617 A1 | * | 2/2008 | Toyoguchi ............... G03B 9/14 |
| | | | 396/464 |
| 2011/0122311 A1 | * | 5/2011 | Han ...................... H02K 33/16 |
| | | | 348/362 |
| 2014/0146378 A1 | | 5/2014 | Agapescu |
| 2017/0343883 A1 | * | 11/2017 | Shi ........................ G03F 7/7055 |
| 2020/0103727 A1 | * | 4/2020 | Wang ...................... G03B 9/58 |
| 2020/0128164 A1 | * | 4/2020 | Balaban ............... H04N 5/2353 |

FOREIGN PATENT DOCUMENTS

| | | |
|---|---|---|
| CN | 102087476 A | 6/2011 |
| CN | 102540633 A | 7/2012 |
| EP | 899595 A2 | 3/1999 |
| JP | H05150288 A | 6/1993 |
| JP | 2007292951 A | 11/2007 |
| JP | 2015-535618 A | 12/2015 |
| WO | WO2016107543 A1 | 7/2016 |

\* cited by examiner

SHUTTER DEVICE, METHOD OF CONTROLLING SAME, PHOTOLITHOGRAPHY MACHINE, AND METHOD OF CONTROLLING EXPOSURE DOSE THEREOF

TECHNICAL FIELD

The present invention relates to the field of photolithography machine and, in particular, to a shutter device and a method of controlling the shutter device as well as to a photolithography machine and a method of controlling an exposure dose thereof.

BACKGROUND

Photolithography is a technique to print a featured pattern onto the surface of a substrate. Substrates commonly used include semiconductor wafers and glass substrates, which are surface-coated with a light-sensitive material. During a photolithography process, a wafer is placed on a wafer stage and the pattern is projected onto the surface thereof by means of an exposure device incorporated in the photolithography equipment.

One of the important metrics for assessing the performance of a photolithography machine is exposure dosage, and accurate control of exposure dose would pose a direct impact on the etching accuracy of the photolithography machine.

Exposure systems adopted in existing medium-end and low-end photolithography machines use high-pressure mercury lamps as their light sources. Such an exposure system utilizes a mechanical shutter disposed in the optical path to enable or disable exposure, and the exposure dose is determined by the exposure time. Specifically, this process may involve: stabilizing an output optical power of the high-pressure mercury lamp by preheating or environmental control; based on a calculated exposure time, starting exposure by opening the shutter and concurrently starting a timer; and upon the expiration of the exposure time, stopping exposure by closing the shutter.

Depending on their blade motion patterns, mechanical shutters for exposure are generally categorized into rotary and linear ones. Shutter motion control is typically achieved in an open-loop or closed-loop manner.

There has been proposed in the prior art a dual-blade rotary shutter which is linearly driven by a permanent magnet attached thereon under the effect of variations in the direction of a magnetic field resulting from changes in the direction of an electric current flowing in an associated coil group. However, the speed control mechanism of this shutter has not been disclosed sufficiently and remains unclear. Another shutter proposed in the prior art is designed to be electromagnetically driven to move linearly. However, this shutter is intended for use in the field of cameras and has a clear aperture diameter of less than 10 mm. In addition, optical energy used in camera applications is too low to meet the requirements of photolithography machine applications.

Still another shutter proposed in the prior art is a motor-driven single-blade rotary shutter which switches between exposure and non-exposure configurations under closed-loop control within a time duration of 150-170 ms (a minimum duration from start of opening to full closure) and delivers a minimum exposure dose of 300 mJ at a light-source illumination intensity of 2000 mW/cm$^2$. However, this shutter is faced with the following major challenges:

(i) exposure at a low dose which is lower than 300 mJ requires the use of an optical attenuator for attenuating the illumination energy;
(ii) the limited exposure duty cycle causes remarkable reductions in yield in low dose exposure; and
(iii) the presence of the optical attenuator and the limited shutter movement speed lead to lower utilization of light-source energy per unit time.

SUMMARY OF THE INVENTION

The present invention aims to provide a shutter device, a method of controlling the shutter device, a photolithography machine and a method of controlling an exposure dose thereof, with a shortened shutter exposure duty cycle, higher yield at a lower exposure dose and improved utilization of light-source energy.

The above aim is attained by a shutter device according to the present invention, which comprises a light blocking unit and a voice coil motor. The voice coil motor comprises a permanent magnet module, a guide track assembly and a coil assembly. The coil assembly is arranged on the guide track assembly, and the permanent magnet module is adapted to produce a magnetic field in the guide track assembly. The light blocking unit comprises two shutter blades both connecting to the coil assembly. The coil assembly is configured to, when energized, produce a magnetic field having a direction same as or opposite to the direction of the magnetic field in the guide track assembly so that the coil assembly moves forward or backward along the guide track assembly to drive the two shutter blades to open or close.

Preferably, the permanent magnet module may comprise two permanent magnet sets arranged in symmetry, each containing two permanent magnets between which the guide track assembly is arranged, wherein the coil assembly comprises two coils, each of which is connected to a corresponding one of the shutter blades and corresponds to a respective one of the permanent magnet sets.

Preferably, the guide track assembly may comprise an iron core.

Preferably, the guide track assembly may be curved or semi-circular.

Preferably, the two shutter blades may be hinged together like a pair of scissors, with an overlap therebetween in a closed configuration of the shutter blades.

Preferably, the shutter blades may be implemented as aluminum blades.

Preferably, the shutter blades may have undergone a black anodizing surface treatment.

Preferably, the shutter device may further comprise a casing, in which the voice coil motor and the light blocking unit are housed, and which defines an aperture in positional correspondence with the light blocking unit.

Preferably, the casing may define a cooling gas inlet for introducing compressed air for cooling the voice coil motor and the light blocking unit.

Preferably, the shutter blades may define a diameter that is greater than a diameter of the aperture.

Preferably, a shaft-bearing assembly may be arranged between the shutter blades and the coil assembly.

Preferably, the shaft-bearing assembly may comprise a bearing seat, a shaft mounted on the bearing seat, bearings attached to the shaft and sleeves fitted over the bearings, wherein the shutter blades are sheathed over the shaft and connected to the coil assembly.

Preferably, the shaft matches with the bearings in transition fits, and the bearings match with the sleeves in transition fits.

Preferably, the bearings may be implemented as double deep groove ball bearings.

Preferably, the shutter device may further comprise position detectors mounted on the bearing seat and foil position sensors mounted on the sleeves at fixed positions with respect to the shutter blade.

Preferably, each of the shutter blades may have a center of gravity that is in the vicinity of a center of the shaft and is closer to a curved edge of the shutter blade.

Preferably, the permanent magnet module and the guide track assembly are both mounted and fixed to the bearing seat.

The above aim is also attained by a method of controlling the shutter device as defined above, comprising: determining an output force of the voice coil motor based on a size of a desired light spot; and determining a current output from a control board to the coil assembly, based on the output force of the voice coil motor, wherein the control board is configured to output, to the coil assembly, a forward current to accelerate movements of the shutter blades and a backward current to decelerate movements of the shutter blades so that the shutter blades can be opened and closed in a cycle consists of four phases: acceleration for opening, deceleration for opening, acceleration for closure and deceleration for closure, each lasting for a defined energizing time duration.

Preferably, the method may further comprise outputting by the control board, to the coil assembly, a current for keeping the shutter blades stationary, which is much lower than the forward and backward currents for accelerating and decelerating the movements of the shutter blades.

Preferably, determining the output force of the voice coil motor based on the size of the desired light spot may comprise: determining an angular travel length for each of the shutter blades based on the size of the desired light spot; and based on the angular travel length, calculating a required force for driving the shutter blades during the opening/closing cycle and hence determining the output force of the voice coil motor.

Preferably, the method may further comprise: optimizing peaks of the currents output from the control board to the coil assembly so that the shutter blades are controlled by an S-shaped speed profile.

The above aim is also attained by a photolithography machine comprising the shutter device as defined above.

The above aim is also attained by an exposure dose control method for use with the photolithography machine as defined above. The method comprises: receiving an instruction indicative of an exposure dose, based on which, an output force of the voice coil motor is determined; and based on the output force of the voice coil motor, determining an current output from the control board to the coil assembly and energizing time durations the coil assembly for a single exposure dose control cycle consisting of actions of: acceleration for opening of the shutter device, under the effect of a forward current output by the control board to the coil assembly; subsequent to completion of the acceleration action, deceleration for opening of the shutter device, under the effect of a backward current output by the control board to the coil assembly; subsequent to completion of the deceleration action, standby of the shutter device, under the effect of a holding current output by the control board to the coil assembly; acceleration for closure of the shutter device, under the effect of a forward current output by the control board to the coil assembly in response to a closing instruction given upon the satisfaction of an time-integrated energy criterion; and subsequent to completion of the acceleration action, deceleration for closure of the shutter device, under the effect of a backward current output by the control board to the coil assembly.

Compared with the prior art, the present invention offers the following advantages: since two shutter blades are used, each of them is allowed to travel a shorter length; the combination of use of the two groups of shutter blades and the use of the large-torque voice coil motor make the exposure shutter device has the following capabilities: a maximum opening/closing angle up to 20° for each shutter blade; a clear aperture of 40 mm; at an average driving power of 15.3 W for each shutter blade, a minimum exposure duty cycle as short as 28.4 ms which leads to a higher speed for switching the shutter blades of the shutter; a minimum exposure dose of 80 mJ which is at an optical power of 170 W at the shutter blades and under an operating condition with a light-source illumination intensity of 2500 mW/cm2; three-times higher yield at low-dose exposure conditions; and higher light-source energy utilization per unit time due to dispensing with optical attenuator.

Figure 1:
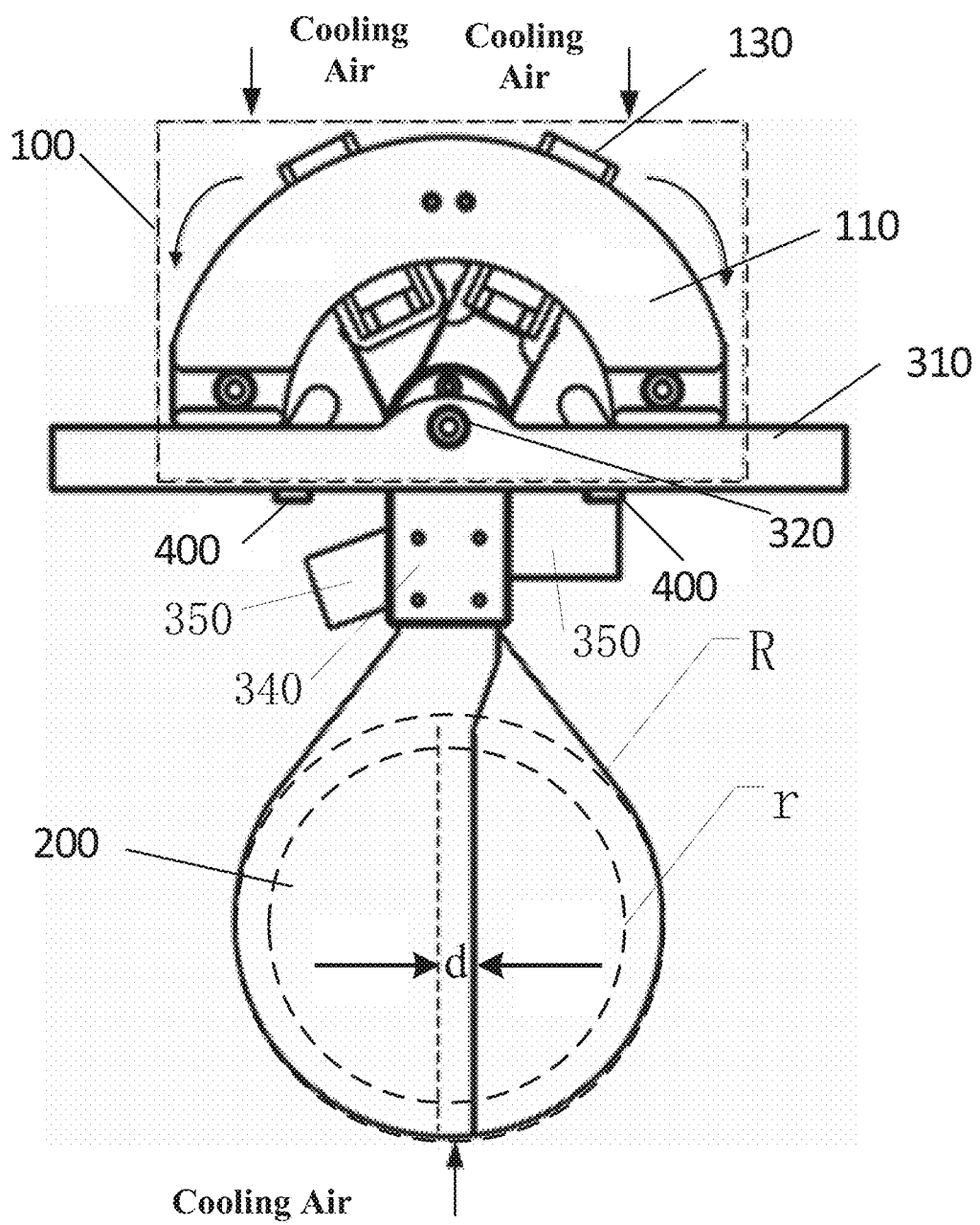
FIG. 1 is a schematic illustration of a shutter device according to Embodiment 1 of the present invention.

In these figures, 100 denotes a voice coil motor; 110 denotes a permanent magnet module; 111 denotes a permanent magnet; 120 denotes a guide track assembly; 130 denotes a coil; 200 denotes a shutter blade; 300 denotes a shaft-bearing assembly; 310 denotes a bearing seat; 320 denotes a shaft; 330 denotes a bearing; 340 denotes a sleeve; 400 denotes a position detector; 350 denotes a foil position sensor; 500 denotes a casing; and 510 denotes an aperture.

DETAILED DESCRIPTION

The above objects, features and advantages of the present invention will become more apparent and better understood from the following detailed description of a few specific embodiments thereof, which is to be read in connection with the accompanying drawings. Note that the figures are much simplified and may not be drawn to scale, and their sole purpose is to facilitate easy and clear explanation of these embodiments.

Embodiment 1

As shown in FIGS. 1-5, an exposure shutter device for use in a photolithography machine, according to the present invention, includes a casing 500, a light blocking unit arranged in the casing 500, a shaft-bearing assembly 300, a voice coil motor 100 and a position detection module. The casing 500 has a size representing an overall size of the exposure shutter device, which is, for example, 160 mm×50 mm×200 mm. The light blocking unit has two shutter blades 200 configured to be driven by the shaft-bearing assembly 300 to rotate about a shaft 320 under the control of the voice coil motor 100.

Figure 2:
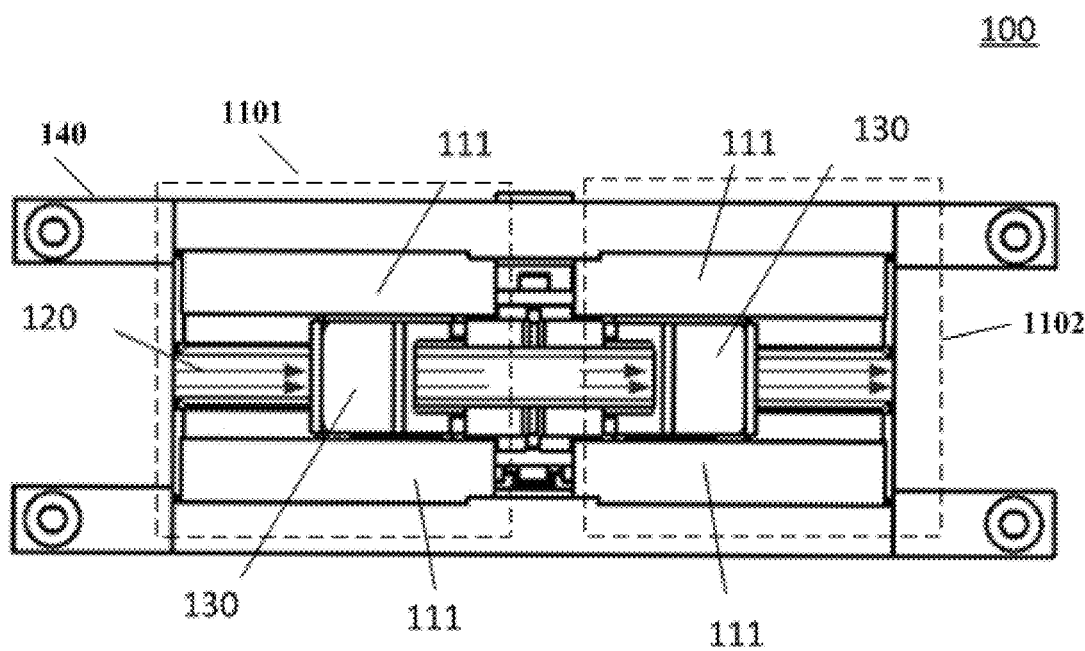
FIG. 2 is a schematic illustration of a voice coil motor according to Embodiment 1 of the present invention.

With particular reference to FIGS. 1-2, the voice coil motor 100 includes a permanent magnet module 110, a guide track assembly 120 and a coil assembly. The permanent magnet module 110 may include two permanent magnet sets 1101, 1102, arranged in symmetry and each containing two permanent magnets 111. The guide track assembly 120 may include an iron core which traverses between the two permanent magnets 111 in each of the two permanent magnet sets 1101, 1102. The coil assembly may include two coils 130 each disposed on the iron core and coupled to a corresponding one of the shutter blades 200. Specifically, each of the two permanent magnet sets may correspond to one of the coils 130, and each of the coils 130 may connect to one of the shutter blades 200, so that the four permanent magnets 111 in the two permanent magnet sets 1101, 1102 can generate, inside the iron core, a magnetic field having a direction along the iron core. When the coils 130 are energized, the coils 130 will produce a magnetic field whose direction is the same as or opposite to the direction of the magnetic field in the iron core. As such, the coils 130 may be controlled to accelerate or decelerate along the iron core by changing the direction of the current in the coils 130.

The voice coil motor 100 may further include a base 140 on which the permanent magnet sets 1101, 1102 and the guide track assembly 120 are mounted. It is to be noted that, since the guide track assembly 120 may be curved or semi-circular, the base 140 and the permanent magnet module 110, according to this embodiment, may also be configured to be curved or semi-circular in order to facilitate the movement of the two shutter blades 200. Therefore, the embodiment of the voice coil motor 100 depicted in FIG. 2 is merely exemplary and illustrative, and the present invention is not limited to any particular shape of the voice coil motor 100.

Figure 3:
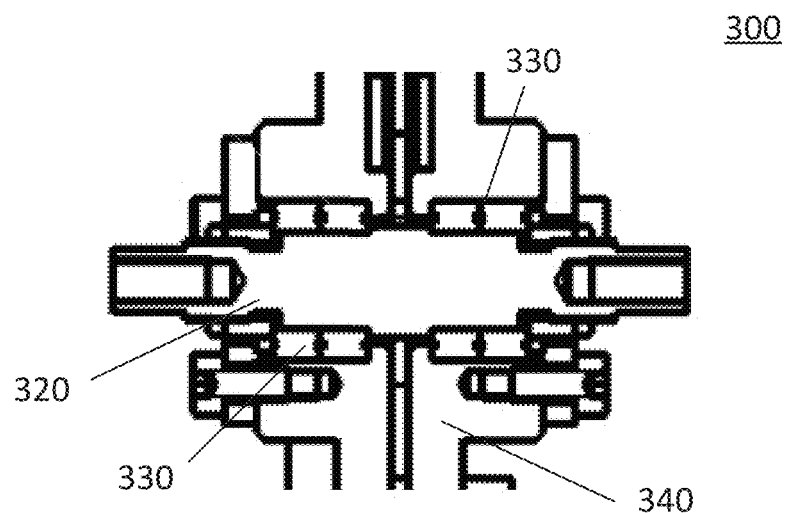
FIG. 3 is a schematic illustration of a shaft-bearing assembly according to Embodiment 1 of the present invention.

With particular reference to FIGS. 1 and 3, the shaft-bearing assembly 300 may include a bearing seat 310, a shaft 320 mounted on the bearing seat 310, bearings 330 attached to the shaft 320 and sleeves 340 disposed over the bearings 330 by transition fits. The two shutter blades 200 connect to the respective coils 130 after being sheathed on the shaft 320, and the shutter blades 200 which are sheathed on the shaft 320 are in turn mounted to the bearing seat 310 by means of the bearings 330 and sleeves 340. The shaft 320 matches with the bearings 330 in transition fits, and the bearings 330 match with the sleeves 340 in transition fits. In this way, axial fluttering of the shutter blades 200 can be minimized. Preferably, the permanent magnet module 110 and the guide track assembly 120 are mounted and fixed to the bearing seat 310, as shown in FIG. 1.

Preferably, the bearings 330 are implemented as double deep groove ball bearings which are advantageous over single bearing in effectively reducing fluttering of the shaft 320 during its high-speed rotation with respect to the bearing seat 310.

Figure 5:
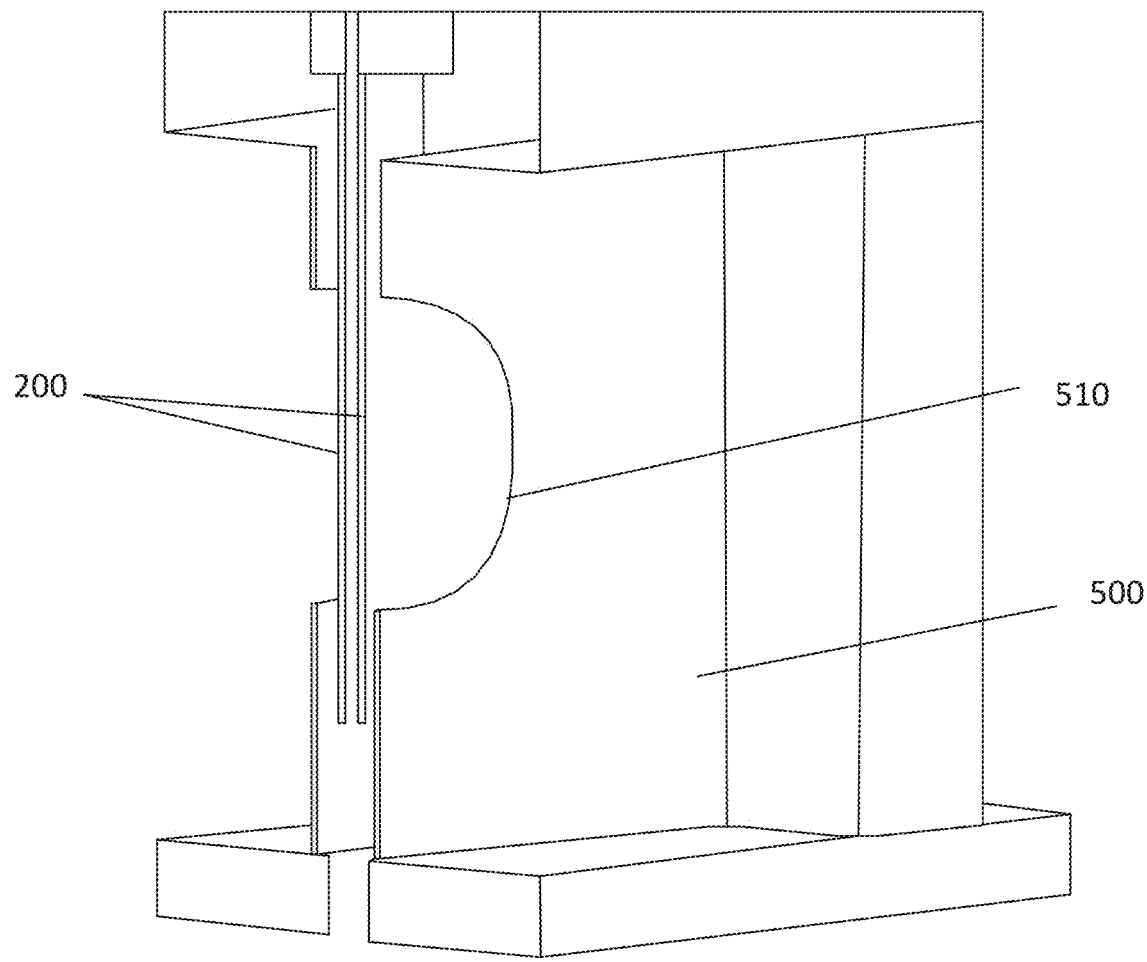
FIG. 5 schematically shows the position of a shutter blade relative to a casing according to Embodiment 1 of the present invention.

As shown in FIG. 5, an aperture 510 is formed in the casing 500 at a location thereof corresponding to the light blocking unit, i.e., to the shutter blades 200. The casing 500 may further be defined with a cooling gas inlet for introducing a small flow of compressed air in order to dissipate heat from the coils 130 and the shutter blades 200. This can avoid the risk of an unstable current in the coils 130 under thermal stress and improve long-term reliability of the shutter blades 200. In order to additionally enhance heat resistance of the shutter blades 200, they can be implemented as aluminum blades exhibiting better heat dissipation performance and less rotational inertia compared to heat-resistant stainless steel blades. The combination of the aluminum blades with the small flow of compressed air ensures efficient heat dissipation of the shutter blades 200.

Referring to FIGS. 1-5, in accordance with the present invention, the two shutter blades 200 may be hinged together like a pair of scissors. In order to effectively reduce the entry of undesired scattered light and reflected light which are introduced through a gap between the two shutter blades 200 into the illumination system in a non-exposure configuration, there may be an overlap between these two shutter blades 200. Specifically, when the gap between the shutter blades 200 (the distance therebetween in the direction perpendicular to the paper plane in FIG. 1) is 2 mm, the overlap may be designed to have a width (indicated as d in FIG. 1) of 8 mm in order to increase the number of reflections that stray light undergoes before it can enter the system. In addition, the shutter blades 200 may have experienced a hard black anodizing process and thus exhibit a reflectance of less than 6% at the surface, so that the stray light can be effectively adsorbed. Further, in order to suppress the influence of light scattering at edges of the aperture 510 in the casing 500, the shutter blades 200 may be designed to be separated from the casing 500 by a clearance of ≤2 mm and span ≥4 mm beyond the edge of the aperture 510. In other words, as shown in FIG. 1, the radius r of the aperture 510 and a radius R of the closed shutter blades meet R−r≥4 mm.

Figure 4:
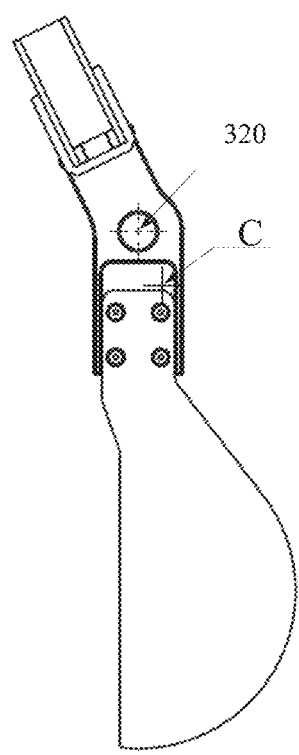
FIG. 4 schematically shows the position of center of gravity of a shutter blade according to Embodiment 1 of the present invention.

Preferably, as shown in FIG. 4, each of the shutter blades 200 may have a center C of gravity that is located lower than the shaft 320 and closer to the curved edge of the shutter blade 200 so that a gravity torque of the shutter blade 200 is greater than a friction torque of the bearing 330, thus allowing the shutter blades 200 to automatically close upon any abnormal power-off to prevent damage to the wafer or wafer stage due to excess illumination of ultraviolet light.

Preferably, the position detection module may include: two position detectors 400 disposed on the bearing seat 310 on opposing sides of the shaft 320; and two foil position sensors 350 both attached to one of the sleeves 340 to which any of the two shutter blades 200 connects. Therefore, the two foil position sensors 350 can rotate with the corresponding shutter blade 200, and the position detectors 400 may be disposed in positional correspondence with the respective foil position sensors 350 in order to detect the opening and closure of the shutter blades 200. In the embodiment depicted in FIG. 1, the two foil position sensors 350 are both attached to the sleeve 340 corresponding to the left shutter blade 200. With this design, when the two shutter blades 200 are closed, the right position detector 400 can detect the position of the right foil position sensor 350 and feeds a signal indicative of "1", while the left position detector 400 cannot detect the left foil position sensor 350 and feeds a signal indicative of "0". The two signals from the position detectors 400 are combined to represent "10", indicating that the two shutter blades 200 are closed. Likewise, when the two shutter blades 200 are opened by pivoting the left shutter blade 200 clockwise and the right shutter blade 200 counterclockwise, the two foil position sensors 350 will also move clockwise. As a result, the right foil position sensor 350 will move away from the right position detector and will be no longer detectable by the right position detector 400. Accordingly, the right position detector 400 will feed a signal indicative of "0". At the same time, the left position detector 400 will become able to detect the left foil position sensor 350 and hence gives a signal indicative of "1". Therefore, the two signals from the position detectors 400 are combined to represent "01", indicating that the two shutter blades 200 are opened. The arrangement and detection of the position detectors 400 and the foil position sensors 350 described above are merely illustrative and exemplary, and it will be readily appreciated by those skilled in the art that the left and right foil position sensors 350 in FIG. 1 may also be interchanged. In this case, both of them are attached to the sleeve 340 corresponding to the right shutter blade 200. When the two shutter blades 200 are closed, the left position detector 400 can detect the position of the left foil position sensor 350, while the right position detector is not able to detect the right foil position sensor 350. When the two shutter blades 200 are opened, the left position detector 400 cannot detect the position of the left foil position sensor 350, while the right position detector becomes able to detect the right foil position sensor 350. Moreover, it is also possible that a signal indicative of "0" is produced upon the detection of any of the foil position sensors 350 and that a signal indicative of "1" is produced upon failure in detecting any of the foil position sensors 350. Apart from what has been described above, any other arrangement and detection approach may also be suitable without departing from the scope of the invention, as long as it allows detecting whether the shutter blades are opened or closed based on whether the position detectors 400 can detect the respective foil position sensors 350.

As can be seen from the above, according to the present invention, since two shutter blades 200 are used, each of them is allowed to travel a shorter length. This, coupled with the use of the large-torque voice coil motor 100, imparts to the exposure shutter device the following capabilities: a maximum opening/closing angle up to 20° for each of the shutter blades 200; a clear aperture of 40 mm; at an average driving power of 15.3 W for each shutter blade 200, a minimum exposure duty cycle as short as up to 28.4 ms, resulting from the shortened blade travel length; a minimum exposure dose of 80 mJ which is at an optical power of 170 W and at the shutter blades 200 under an operating condition with a light-source illumination intensity of 2500 mW/cm$^2$; yield thrice that of conventional devices at low-dose exposure conditions; and higher light-source energy utilization per unit time due to dispensing with optical attenuator.

Figure 6:
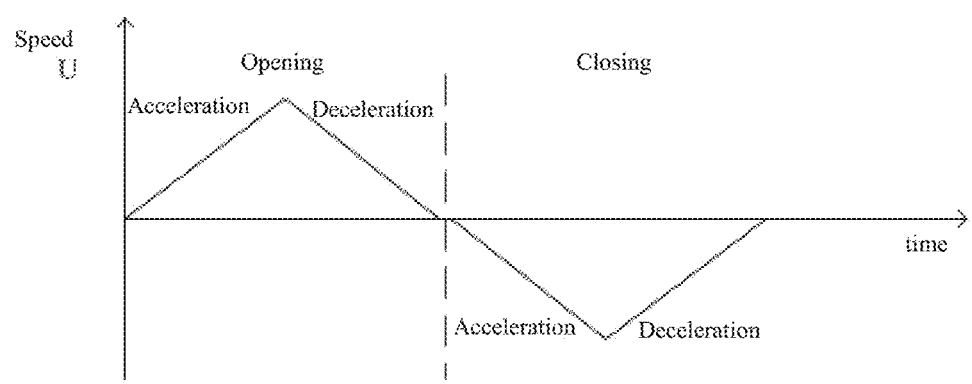
FIG. 6 schematically illustrates shutter blade speed control according to Embodiment 1 of the present invention.

FIG. 6 is a schematic diagram illustrating shutter blade speed control over time during an opening/closing cycle of the exposure shutter device of the present invention, consisting essentially of the following phases: acceleration for opening, deceleration for opening, acceleration for closure and deceleration for closure.

Referring to FIGS. 1-5, the present invention also provides a method of controlling an exposure shutter device for use in a photolithography machine. The method may employ open-loop current control over the shutter device and include the actions as detailed below.

At first, a required angular travel length for each single shutter blade 200 is calculated based on the size of a desired exposure light spot, and a force required to drive the shutter blades 200 during the opening/closing cycle are calculated based on the travel length and hence a force generated from the voice coil motor 100 can be determined. These calculations may use the following equations:

$$L = 0.5 \cdot \xi \cdot t^2 \ldots \quad (1)$$

$$M = J \cdot \xi \ldots \quad (2)$$

$$M = F \cdot l \ldots \quad (3)$$

where, L denotes the angular travel length of a single shutter blade 200; t denotes the minimum time duration of the opening/closing cycle, which is 30 ms (i.e., the minimum time the shutter is expected to take no more than 30 ms to complete the cycle from start of opening to full closure); J denotes an angular moment of inertia of the single shutter blade 200, which is 0.000042 Kg·m$^2$; M denotes an angular torque; $\xi$ denotes an angular velocity of the shutter blade 200; and l denotes a length of moment arm of the coil 130.

Therefore, the force F required to drive the single shutter blade 200, i.e., the output force F generated from the voice coil motor 100, during the shutter opening/closing cycle can be obtained from:

$$F = M/l = 2 \cdot J \cdot L/(t^2 \cdot l) \approx 13N$$

When further taking into account friction and other factors, the output force F of the voice coil motor 100 can be determined as 14N.

Figure 7:
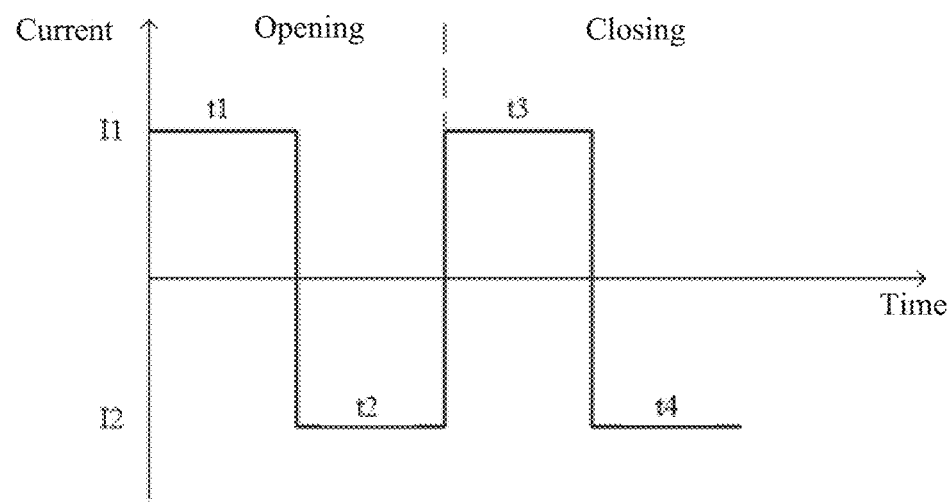
FIG. 7 schematically illustrates how open-loop control for a shutter device works in accordance with Embodiment 1 of the present invention.

Based on this output force of the voice coil motor 100, the magnitude and direction of the current for energizing the coils 130 can be determined and provided to the coils 130 by a control board (not shown). When the shutter blade is stationary, the control board may output a forward current I1 to open the shutter blades 200 or output a backward current I2 to close the shutter blades 200. In the opening/closing cycle of the shutter blades 200, a forward current I1 from the control board can accelerate the shutter blades 200 for opening/closure, and likewise a backward current I2 from the control board can decelerate the shutter blades 200 for opening/closure. Energizing time durations t1, t2, t3 and t4 for the aforesaid respective phases of the shutter blades 200, i.e., acceleration for opening, deceleration for opening, acceleration for closure and deceleration for closure, may be set to control the opening/closing cycle of the shutter, but there exists the constraint: t1+t2+t3+t4≤30 ms, as shown in FIG. 7. In order to keep the shutter blades 200 doing nothing and staying stationary, the control board may output a current that is much lower than the forward and backward currents.

Electrical parameters of the shutter device used in the above method mainly include: a resistance for each single coil 130 of <6Ω; a current in the coil 130 of <5 A; and a power of <22 W.

Figure 8:
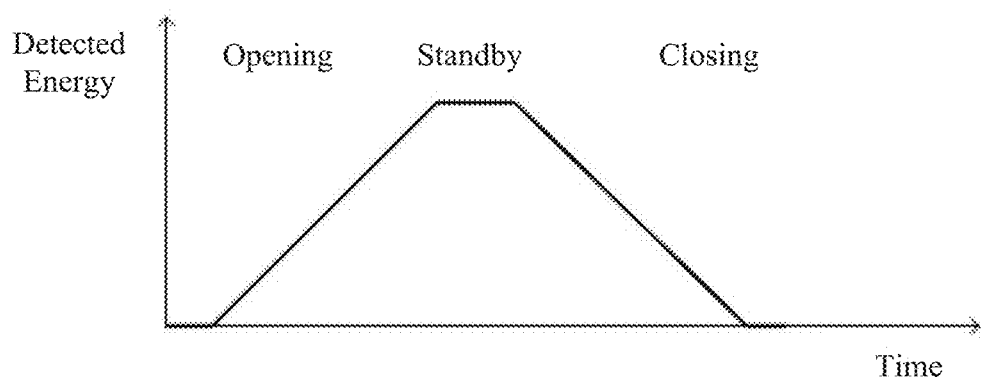
FIG. 8 schematically illustrates the evolution of detected energy during an exposure process performed by a photolithography machine over time in accordance with Embodiment 1 of the present invention.

FIG. 8 schematically illustrates evolution of detected energy over time during an exposure process. Shutter dose control in the exposure process may include: based on a received exposure dose instruction, the control board outputting forward and backward currents for enabling shutter blade acceleration and deceleration actions for opening of the exposure shutter device; subsequent to the deceleration action, the control board outputting a holding current which is much lower than the forward and backward currents and keeps the shutter blades 200 stationary (so that the shutter is maintained open, as shown in the figure); and upon the satisfaction of a time-energy criterion, providing a closing instruction, based on which, the control board outputs forward and backward currents to cause the shutter blades 200 to take acceleration and deceleration actions for closure.

Embodiment 2

Figure 9:
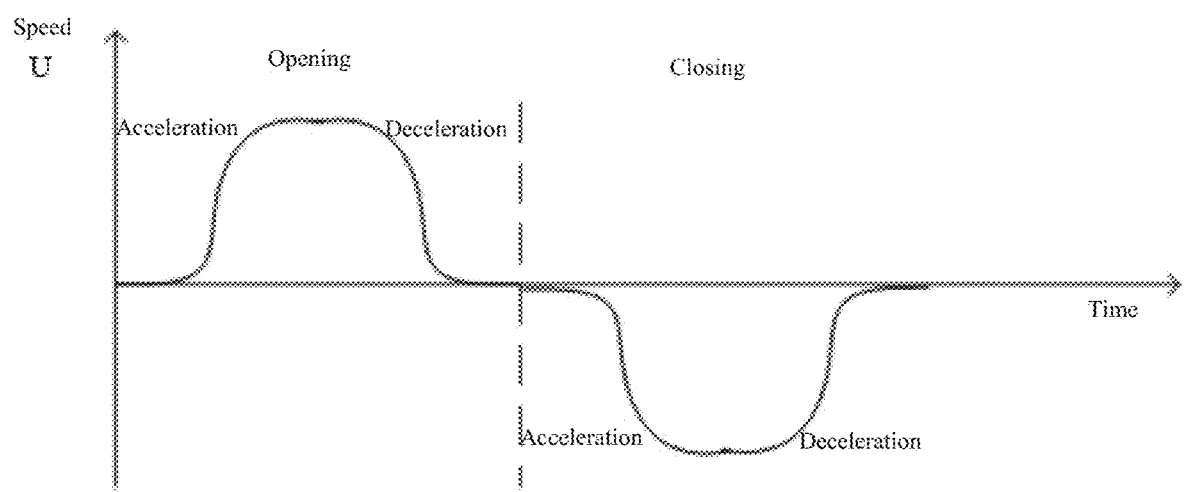
FIG. 9 schematically illustrates shutter blade speed control according to Embodiment 2 of the present invention.

When the exposure shutter device operates at an electric power below 20 W, peak values of the output currents from the control board can be optimized to expedite the opening/closure of the shutter blades 200 to achieve a minimum exposure duty cycle lasting for 20 ms under a condition with a light-source illumination intensity of 3000 mW/cm$^2$. From a comparison between FIGS. 9 and 6, it can be seen that this embodiment differs from Embodiment 1 in that the control board is optimized, such that the light blocking unit, i.e., the shutter blades 200, is controlled to follow an S-shaped speed profile. As a result, vibration frequency and amplitude of the shutter blades 200 can be reduced, ensuring more effectively the exposure dose accuracy and repeatability.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A shutter device, comprising:
   a voice coil motor, comprising:
      a permanent magnet module;
      a guide track assembly; and
      a coil assembly, arranged on the guide track assembly; and
   a light blocking unit, comprising:
      two shutter blades, connecting to the coil assembly;
   wherein, the permanent magnet module is configured to produce a magnetic field in the guide track assembly; the coil assembly is configured to, when energized, produce a magnetic field having a direction same as or opposite to a direction of the magnetic field in the guide track assembly, so that the coil assembly moves forward or backward along the guide track assembly to drive the two shutter blades to open or close, and directions of current in the coil assembly is changed to control speeds at which the two shutter blades are opened or closed;
   wherein a shaft-bearing assembly is arranged between the shutter blades and the coil assembly, and the shaft-bearing assembly comprises a bearing seat, a shaft mounted on the bearing seat, bearings attached to the shaft and sleeves fitted over the bearings, and wherein the shutter blades are sheathed over the shaft and connected to the coil assembly;
   wherein each of the shutter blades has a center of gravity that is in vicinity of a center of the shaft and is closer to a curved edge of the shutter blade.

2. The shutter device of claim 1, wherein the permanent magnet module comprises two permanent magnet sets arranged in symmetry, each containing two permanent magnets between which the guide track assembly is arranged, and wherein the coil assembly comprises two coils, each of which is connected to a corresponding one of the shutter blades and corresponds to a respective one of the permanent magnet sets.

3. The shutter device of claim 1, wherein the guide track assembly comprises an iron core which is curved or semi-circular; and the iron core traverses between the two permanent magnets in each of the two permanent magnet sets.

4. The shutter device of claim 1, wherein the two shutter blades are hinged together like a pair of scissors, with an overlap therebetween in a closed configuration of the shutter blades.

5. The shutter device of claim 1, wherein the shutter blades have undergone a black anodizing surface treatment.

6. The shutter device of claim 1, further comprising a casing in which the voice coil motor and the light blocking unit are housed, the casing defining an aperture in positional correspondence with the light blocking unit.

7. The shutter device of claim 6, wherein the casing defines a cooling gas inlet for introducing compressed air for cooling the voice coil motor and the light blocking unit.

8. The shutter device of claim 6, wherein the shutter blades define a diameter that is greater than a diameter of the aperture.

9. The shutter device of claim 1, wherein the shaft matches with the bearings in transition fits, and the bearings match with the sleeves in transition fits.

10. The shutter device of claim 1, wherein the bearings are implemented as double deep groove ball bearings.

11. The shutter device of claim 1, further comprising position detectors mounted on the bearing seat and foil position sensors mounted on the sleeves at fixed positions with respect to the shutter blade.

12. The shutter device of claim 1, wherein the permanent magnet module and the guide track assembly are both mounted and fixed to the bearing seat.

13. A method of controlling a shutter device, the shutter device comprising:
   a voice coil motor, comprising:
      a permanent magnet module;
      a guide track assembly; and
      a coil assembly, arranged on the guide track assembly; and
   a light blocking unit, comprising:
      two shutter blades, connecting to the coil assembly;
   wherein, the permanent magnet module is configured to produce a magnetic field in the guide track assembly; the coil assembly is configured to, when energized, produce a magnetic field having a direction same as or opposite to a direction of the magnetic field in the guide track assembly, so that the coil assembly moves forward or backward along the guide track assembly to drive the two shutter blades to open or close, and directions of current in the coil assembly is changed to control speeds at which the two shutter blades are opened or closed;
   wherein a shaft-bearing assembly is arranged between the shutter blades and the coil assembly, and the shaft-bearing assembly comprises a bearing seat, a shaft mounted on the bearing seat, bearings attached to the shaft and sleeves fitted over the bearings, and wherein the shutter blades are sheathed over the shaft and connected to the coil assembly;
   wherein each of the shutter blades has a center of gravity that is in vicinity of a center of the shaft and is closer to a curved edge of the shutter blade; and
   the method comprising:
      determining an output force of the voice coil motor based on a size of a desired light spot; and determining a current output from a control board to the coil assembly, based on the output force of the voice coil motor;

wherein the control board is configured to output, to the coil assembly, a forward current to accelerate movements of the shutter blades and a backward current to decelerate movements of the shutter blades so that the shutter blades can be opened and closed in a cycle consists of four phases: acceleration for opening, deceleration for opening, acceleration for closure and deceleration for closure, each lasting for a defined energizing time duration.

14. The method of claim 13, further comprising outputting by the control board, to the coil assembly, a current for keeping the shutter blade stationary, which is much lower than the forward and backward currents for accelerating and decelerating the movements of the shutter blades.

15. The method of claim 13, wherein determining the output force of the voice coil motor based on the size of the desired light spot comprises: determining an angular travel length for each of the shutter blades based on the size of the desired light spot; and based on the angular travel length, calculating a required force for driving the shutter blades during the opening/closing cycle and hence determining the output force of the voice coil motor.

16. The method of claim 13, further comprising: optimizing peaks of the current output from the control board to the coil assembly so that the shutter blades are controlled by an S-shaped speed profile.

17. An exposure dose control method for use with a photolithography machine comprising a shutter device, the shutter device comprising:
a voice coil motor, comprising:
a permanent magnet module;
a guide track assembly; and
a coil assembly, arranged on the guide track assembly; and
a light blocking unit, comprising:
two shutter blades, connecting to the coil assembly;
wherein, the permanent magnet module is configured to produce a magnetic field in the guide track assembly; the coil assembly is configured to, when energized, produce a magnetic field having a direction same as or opposite to a direction of the magnetic field in the guide track assembly, so that the coil assembly moves forward or backward along the guide track assembly to drive the two shutter blades to open or close, and directions of current in the coil assembly is changed to control speeds at which the two shutter blades are opened or closed;

wherein a shaft-bearing assembly is arranged between the shutter blades and the coil assembly, and the shaft-bearing assembly comprises a bearing seat, a shaft mounted on the bearing seat, bearings attached to the shaft and sleeves fitted over the bearings, and wherein the shutter blades are sheathed over the shaft and connected to the coil assembly;

wherein each of the shutter blades has a center of gravity that is in vicinity of a center of the shaft and is closer to a curved edge of the shutter blade; and the method comprising: receiving an instruction indicative of an exposure dose, based on which, an output force of the voice coil motor is determined; and based on the output force of the voice coil motor, determining an current output from the control board to the coil assembly and energizing time durations of the coil assembly for a single exposure dose control cycle consisting of actions of: acceleration for opening of the shutter device, under an effect of a forward current output by the control board to the coil assembly; subsequent to completion of the acceleration action, deceleration for opening of the shutter device, under an effect of a backward current output by the control board to the coil assembly; subsequent to completion of the deceleration action, standby of the shutter device, under an effect of a holding current output by the control board to the coil assembly; acceleration for closure of the shutter device, under an effect of a forward current output by the control board to the coil assembly in response to a closing instruction given upon the satisfaction of an time-energy criterion; and subsequent to completion of the acceleration action, deceleration for closure of the shutter device, under an effect of a backward current output by the control board to the coil assembly.

* * * * *